United States Patent
Khondaker et al.

(10) Patent No.: US 9,472,396 B2
(45) Date of Patent: Oct. 18, 2016

(54) PLASMA TREATED SEMICONDUCTOR DICHALCOGENIDE MATERIALS AND DEVICES THEREFROM

(71) Applicant: University of Central Florida Research Foundation, Inc., Orlando, FL (US)

(72) Inventors: Saiful Khondaker, Oviedo, FL (US); Muhammad Islam, Orlando, FL (US); Laurene Tetard, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 0 days.

(21) Appl. No.: 14/687,507

(22) Filed: Apr. 15, 2015

(65) Prior Publication Data

US 2015/0294875 A1    Oct. 15, 2015

Related U.S. Application Data

(60) Provisional application No. 61/979,714, filed on Apr. 15, 2014.

(51) Int. Cl.
| | | |
|---|---|---|
| H01L 21/02 | (2006.01) | |
| H01L 29/78 | (2006.01) | |
| H01L 29/51 | (2006.01) | |
| H01L 29/778 | (2006.01) | |
| H01L 29/24 | (2006.01) | |

(52) U.S. Cl.
CPC ..... *H01L 21/02271* (2013.01); *H01L 21/0234* (2013.01); *H01L 21/02175* (2013.01); *H01L 29/24* (2013.01); *H01L 29/778* (2013.01)

(58) Field of Classification Search
CPC .......... H01L 21/02271; H01L 21/02175; H01L 21/0234; H01L 21/28194; H01L 21/02274; H01L 29/78; H01L 29/517

USPC .......................................................... 257/411
See application file for complete search history.

(56) References Cited

U.S. PATENT DOCUMENTS

| | | | | |
|---|---|---|---|---|
| 4,552,749 A | * | 11/1985 | McHugh | B01J 8/10 423/53 |
| 8,916,914 B2 | * | 12/2014 | Kim | H01L 29/151 257/288 |
| 2004/0178414 A1 | * | 9/2004 | Frey | H01L 51/5206 257/79 |
| 2005/0023522 A1 | * | 2/2005 | Frey | H01L 51/0021 257/40 |
| 2007/0181938 A1 | * | 8/2007 | Bucher | H01L 29/26 257/325 |
| 2010/0283041 A1 | * | 11/2010 | Nakamura | B82Y 10/00 257/40 |
| 2012/0034154 A1 | * | 2/2012 | McHugh | C01B 3/04 423/539 |
| 2014/0239257 A1 | | 8/2014 | Moon | |

OTHER PUBLICATIONS

Yulu Liu, et al., "Layer-by-Layer Thinning of MoS2 by Plasma", ACS Nano, vol. 7, No. 5, Apr. 2, 2013, pp. 4202-4209.

(Continued)

*Primary Examiner* — Christine Enad
(74) *Attorney, Agent, or Firm* — Jetter & Associates, P.A.

(57) ABSTRACT

A plasma-based processing method includes depositing a transition metal dichalcogenide (TMDC) material onto a substrate. The TMDC material is plasma treated in an oxygen containing ambient to oxidize the TMDC material to form oxidized dielectric TMDC material. The oxidized dielectric TMDC material has a higher electrical resistivity as compared an electrical resistivity of the TMDC material before the plasma treating, typically $>10^3$ times greater.

12 Claims, 6 Drawing Sheets

(56) References Cited

OTHER PUBLICATIONS

Hongsuk Nam, et al., "MoS2 Transistors Fabricated via Plasma-Assisted Nanoprinting of Few-Layer MoS2 Flakes into Large-Area Arrays", vol. 7, No. 7, Jun. 22, 2013, pp. 5870-5881.

Kin Fai Mak, et al., "Atomically Thin MoS2: A New Direct-Gap Semiconductor", American Physical Society, Physical Review Letters, PRL 105, Sep. 24, 2010, pp. 13805-1-13805-4.

\* cited by examiner

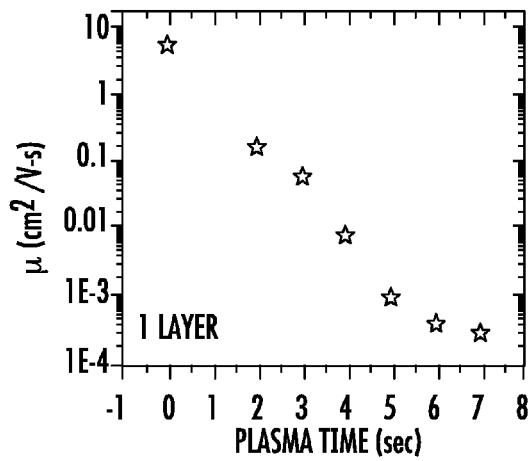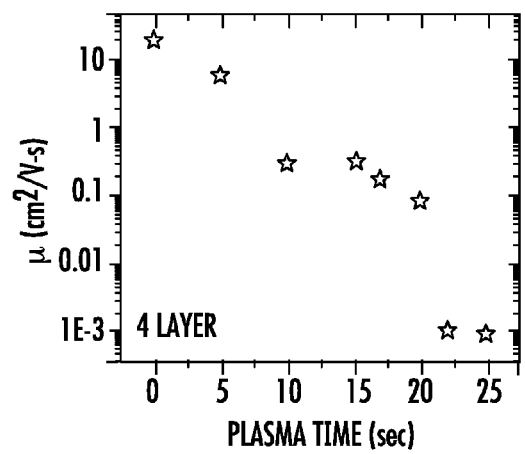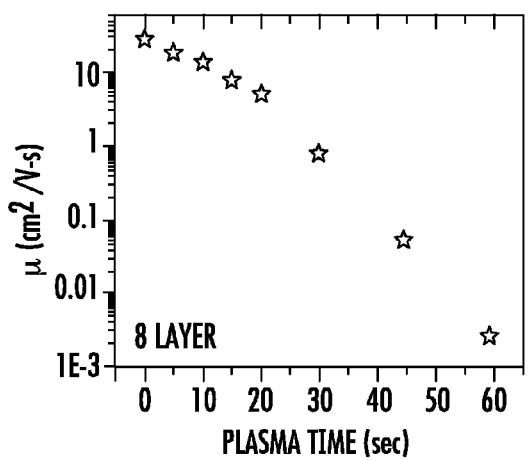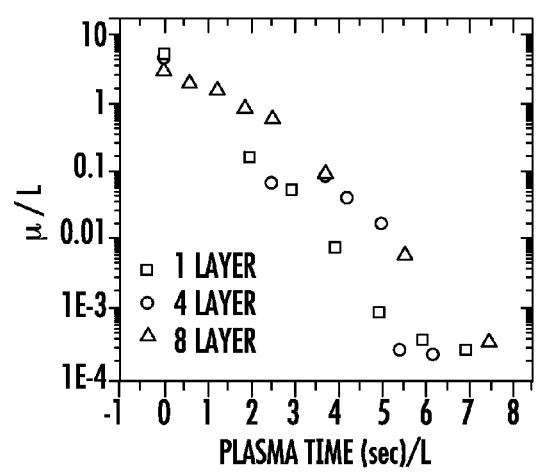
FIG. 7A
FIG. 7B
FIG. 7C
FIG. 7D

PLASMA TREATED SEMICONDUCTOR DICHALCOGENIDE MATERIALS AND DEVICES THEREFROM

CROSS REFERENCE TO RELATED APPLICATIONS

This application claims the benefit of Provisional Application Ser. No. 61/979,714 entitled "PLASMA TREATED SEMICONDUCTOR DICHALCOGENIDE MATERIALS AND DEVICES THEREFROM", filed on Apr. 15, 2014, which is herein incorporated by reference in its entirety.

FIELD

Disclosed embodiments relate to semiconductor transition metal dichalcogenide (TMDC) materials and devices including such materials.

BACKGROUND

While graphene has a very high carrier mobility, the lack of a bandgap limits the application of graphene in nanoelectronic and optical devices. Recently single layer and few layer $MoS_2$ sheets have been receiving significant attention due to their tunable band gap from 1.2 eV in the bulk to 1.8 eV in a single layer.

Field effect transistors (FETs) based on single layer $MoS_2$ have shown fast current switching with a mobility of about 250 $cm^2$/Vs. In addition, phototransistor, chemical sensor, photovoltaic devices, and integrated circuits have been demonstrated based on $MoS_2$.

Significant progress has been made in modifying and controlling the intrinsic properties of $MoS_2$. The ability to modulate the electronic and optical properties further widen the applications of 2D $MoS_2$ and may open up a new era in solid state electronics and opto-electronics. However, such modification of physical properties is of significant challenge as it requires controllably tuning the material properties.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include plasma oxidation methods for selectively oxidizing a single layer or a few layer 2D semiconductor transition metal dichalcogenide (TMDC) material to reduce its electrical conductivity. As defined herein, a semiconductor is a material having an electrical conductivity between that of an electrical conductor such as the metal copper and that of an electrical insulator (or dielectric) such as a silica, with a 25° C. resistivity of between $10^7$ and $10^{-3}$ ohm-cm.

In one particular embodiment, a $MoS_2$ flake material is changed by plasma processing from a semiconductor to insulator (dielectric). Although the TMDC material is described herein as being $MoS_2$, the TMDC material can be other materials provided they are semiconductors and can be oxidized by disclosed plasma processing including oxygen to raise the resistivity of the material to that of an insulator. For example, the TMDC can also generally comprise $MoSe_2$, $WS_2$, $WSe_2$, $In_2Se_3$, or GaTe.

BRIEF DESCRIPTION OF THE DRAWINGS

FIG. 1B shows the output characteristics of a FET including a single layer of oxidized dielectric $MoS_2$ at different back gate voltages ($V_G$) ranging from −60V to 40V with a voltage interval of 20 V, while

FIG. 6A shows a structural model of electrical property tuning via defect engineering in $MoS_2$ single layer as a function of oxygen plasma exposure time, while

FIGS. 7A-D show the effect of plasma exposure time on the mobility with FIG. 7A for 1 layer, FIG. 7B for 4 layers, and FIG. 7C for an 8 layer $MoS_2$ device. FIG. 7D is a plot of Mobility/Layer vs. Plasma time/Layer for 1 layer, 4 layer and an 8 layer FET and it was found that the curves for the different devices essentially collapse into same line.

DETAILED DESCRIPTION

Figure 1A:
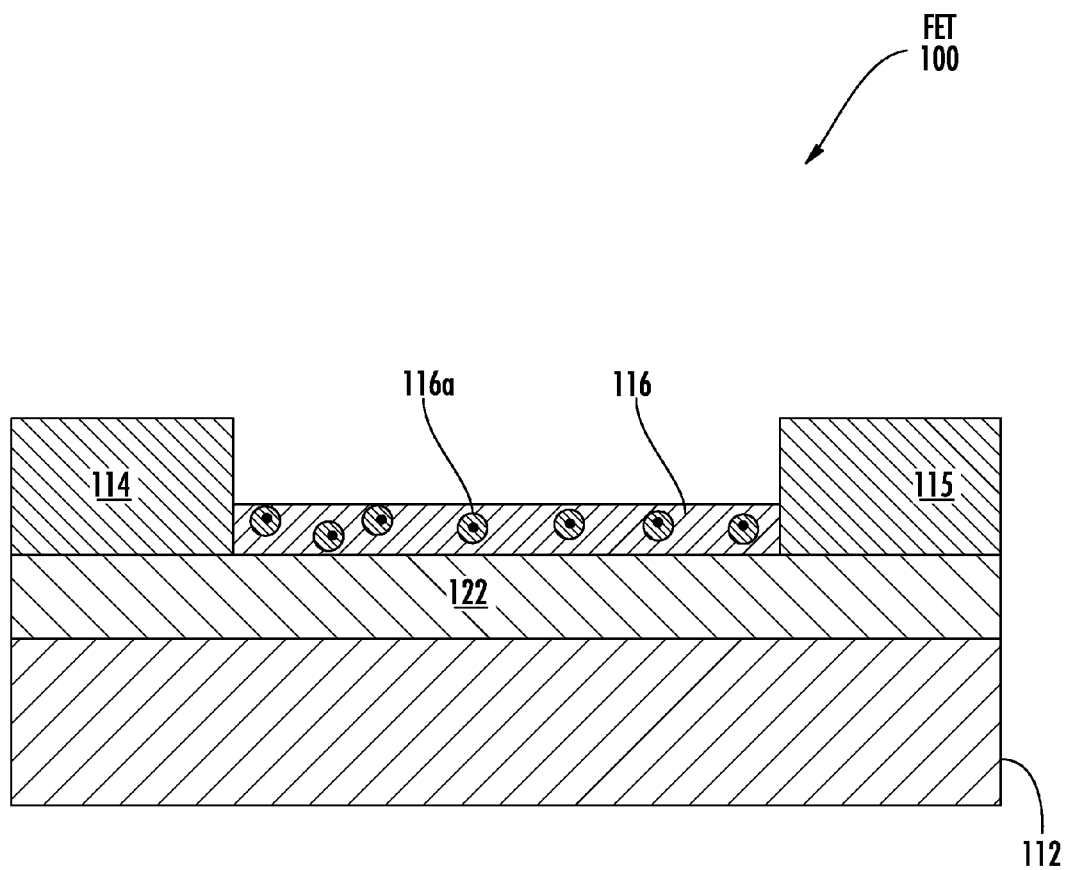
FIG. 1A is a cross sectional schematic diagram of an example back-gated field effect transistor (FET) that includes a disclosed oxidized dielectric TMDC layer, according to an example embodiment.

Disclosed embodiments are described with reference to the attached figures, wherein like reference numerals, are used throughout the figures to designate similar or equivalent elements. The figures are not drawn to scale and they are provided merely to illustrate aspects disclosed herein. Several disclosed aspects are described below with reference to example applications for illustration. It should be understood that numerous specific details, relationships, and methods are set forth to provide a full understanding of the embodiments disclosed herein.

One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. Disclosed embodiments are not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Mechanisms are described below that are believed to explain the observed phenomena provided by disclosed embodiments. Although the mechanisms described herein are believed to be accurate, disclosed embodiments may be practiced independent of the particular mechanism(s) that may be operable.

Disclosed embodiments recognize for semiconductor TMDC materials such as $MoS_2$ to be used as a building block for lateral devices such as lateral FETs, it is necessary to develop a technique for the fabrication of tunable electrical insulator regions that can be rendered "on demand" tunnel region(s). Disclosed plasma oxidation methods provide a relatively simple approach enabling the fabrication of lateral FETs where a controllable (selectable) dielectric TMDC region can be created on the surface of a two-dimensional (2D) semiconductor TMDC material, in contrast to known heterostructures in a vertical geometry where 2D materials of different bandgaps are placed on top of each other. The 2D TMDC material is generally a layer that is one (1) to eight (8) atomic layers thick, and disclosed plasma treating generally oxidizes regions in all the layer(s) of the TMDC material. For $MoS_2$ 1 atomic layer corresponds to about 0.9 nms thick, and 8 atomic layers corresponds to about 6 nms thick.

$MoS_2$ is a 2D TMDC material representing a new classes of materials, generally having good electrical, mechanical and optical properties. Disclosed embodiments include oxygen plasma techniques for tuning the electrical properties of the layer(s) of TMDC materials such as $MoS_2$ flakes from being a semiconductor to an insulator. Such controlled changes to the electrical properties of TMDC materials such as $MoS_2$ is expected to be of significant importance for a variety of nano-electronic device applications such as FETs, sensors, diodes and quantum devices.

In one embodiment, a single layer or multilayer $MoS_2$-based FET device is formed using disclosed methods. In one specific embodiment, $MoS_2$ deposited unto a substrate is then exposed to an oxygen plasma (e.g., $O_2$:Ar mixture of 20%:80% by volume) treatment for different time durations. It has been shown that the mobility, ON current and electrical resistance of a single layer and multilayer $MoS_2$ FET varies exponentially by up to four orders of magnitude with the plasma exposure time. Raman and XPS study of the $MoS_2$ flakes that were exposed to $O_2$ plasma reveal dominant $MoO_3$ peaks. It is believed while exposed to oxygen plasma, energetic oxygen molecules interact with $MoS_2$ to create $MoO_3$ rich defect regions which are insulating (dielectric). The area coverage of the defect region increases with increasing exposure time. This effect can be exploited in fabricating lateral TMDC-based FETs without the need to pattern the TMDC layer.

FIG. 1A is a cross sectional diagram of an example back-gated FET (FET) 100 including an oxidized dielectric TMDC layer 116 including defects regions (defects) 116a therein comprising molybdenum trioxide, $MoO_3$, according to an example embodiment. The TMDC layer 116 that is not shown as defects 116a provides the active layer for HFET which has the geometry of a conventional lateral FET. FET 100 comprises a TMDC layer 116 on a gate dielectric layer 122 on an electrically conductive substrate 112. The gate dielectric layer 122 may comprise silicon nitride (SiN), silicon dioxide ($SiO_2$), Boron Nitride (BN), aluminum oxide ($Al_2O_3$), or hafnium oxide ($HfO_2$), among other suitable insulators.

As the substrate 112 is used as a back-gate for the FET 100, the substrate 112 may comprise highly doped (n+ or p+) Si, typically doped to at least $5 \times 10^{18}$ $cm^{-3}$, or another electrically conductive substrate material. Contacting respective sides of the oxidized dielectric TMDC layer 116 is a source contact 114 and a drain contact 115 which each provide a low resistance Ohmic contact. The source contact 114 and a drain contact 115 may also be on the oxidized dielectric TMDC layer 116. The source contact 114 and drain contact 115 can comprise a metal or metal alloy, such as gold (Au), Nickel (Ni), or Scandium (Sc).

Regarding operation of FET 100, a gate bias (Vg) is applied to the substrate 112 relative to the source. A source-drain bias (Vds) is then applied between source contact 114 and a drain contact 115, such as Vds=100 mV. A positive gate voltage induce charges in TMDC 116 and changes the current (Id). The oxygen plasma create defects 116a being $MoO_3$ regions, which create bottlenecks for current flow. FET 100 is turned ON and OFF by applying a bias to the substrate 112 acting as a back gate. At Vgs=0, the FET 100 may not be fully OFF as shown in FIG. 1C described below.

A method of fabricating TMDC-based lateral FET can include the following steps. A TMDC layer (e.g. $MoS_2$) 116 is deposited on an electrically conductive substrate 112 by mechanical exfoliation, chemical vapor deposition (CVD) or an epitaxial processes. In mechanically exfoliation a bulk TMDC crystal is exfoliated to generate flakes that are deposited onto the substrate 112. Another approach for depositing the TMDC layer is using an atomic layer deposition (ALD) process at about 300° C., such as a CVD process, but process control for the ALD process may be limited as compared to exfoliation. Then metal (ohmic) source and drain contacts 114 and 115 are formed on opposite ends of the TMDC layer 116 for providing the source and drain contact. The device is then exposed to a disclosed oxygen gas plasma and a defect induced oxidized dielectric TMDC layer 116 is formed including defects 116a.

EXAMPLES

Disclosed embodiments of the invention are further illustrated by the following specific Examples, which should not be construed as limiting the scope or content of this Disclosure in any way.

Device Fabrication:

Example devices were fabricated using single layer $MoS_2$ flakes that were mechanically exfoliated from a commercially available crystal of molybdenite (SPI Supplies Brand, Natural Molybdenite) using an adhesive tape micromechanical cleavage technique and deposited on a highly doped Si substrate capped with a thermally grown 250 nm thick layer of SiO$_2$. Before MoS$_2$ deposition, the Si/SiO$_2$ wafers were cleaned using oxygen plasma followed by rinsing in acetone and isopropyl alcohol.

An atomic force microscopy (AFM) height profile indicated a MoS$_2$ thickness of 0.9 nm, corresponding to a single layer. The number of MoS$_2$ layers was further confirmed by a Raman study. Laser power was kept below 1 mW in order to avoid any damage to the MoS$_2$ flake and on the other hand sufficient to obtain a good signal to noise ratio. Two prominent peaks at E2g and A1 g corresponding to in-plane and out-of-plane vibrations of atoms were identified separated by a Raman shift $\Delta=19.46$ cm$^{-1}$ confirms the single layer nature of the flake. Standard electron beam lithography (EBL) was used to pattern metal contacts corresponding to source contact 114 and drain contact 115 on the MoS$_2$ flakes. Other metal contact techniques can also be used such as optical lithography.

For the fabrication of a MoS$_2$ FET. first a double layer electron beam resist, methyl methacrylate/poly(methyl methacrylate) (MMA/PMMA), was spun on the substrate and baked, followed by e-beam exposure and development in (1:3) methyl isobutyl ketone:isopropyl alcohol (MIBK:IPA). After defining the electrodes (source contact 114 and drain contact 115), 35 nm Au was deposited by thermal evaporation, followed by liftoff in acetone.

The electron transport measurements of the MoS$_2$ FET were performed in a probe station at ambient condition using a Keithley 2400 source meter and a DL instruments 1211 current preamplifier interfaced with LabView program. The measurements were performed before and after each oxygen plasma treatment. The plasma treatment on the MoS$_2$ FETs was carried out using a commercial (Plasma Etch, PE-500) plasma chamber at a power of 100 W operating at 50 kHz. During plasma exposure, the pressure within the plasma chamber was held at 1 Torr and a gas mixture of Oxygen (20%) and Argon (80%) flow at a constant rate of 15 sccm. Each time, the sample was exposed for 5 sec and the electron transport measurements were repeated.

Figure 1B:
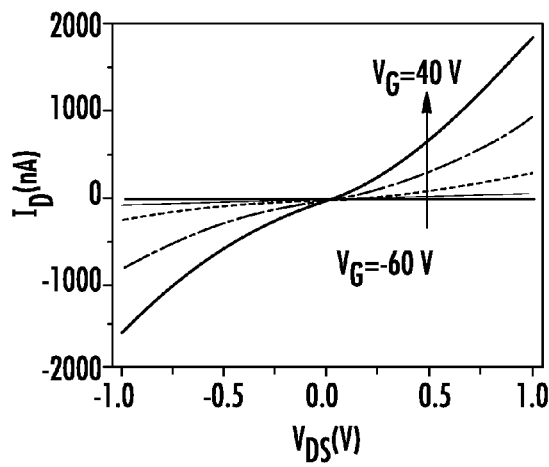
Figure 1C:
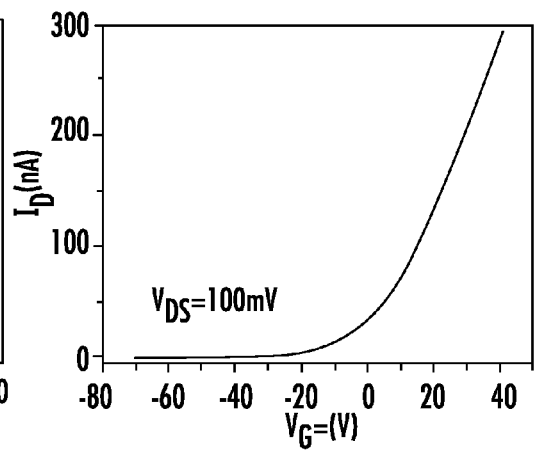
FIG. 1C shows transfer characteristics of the single layer $MoS_2$ device.

Results and Discussions:

FIG. 1B shows the output characteristics ($I_D$ vs. $V_{DS}$) for different back-gate voltages ($V_{BG}$) for FET 100 varying from −20 to 40 V (bottom to top) with a step size of 10 V. An increase of drain current with gate voltage indicates n-type FET behavior. FIG. 1C shows the transfer characteristics (drain-current $I_{DS}$ as a function of back-gate voltage $V_G$) for FET 100 measured at a fixed source-drain bias voltage $V_{DS}=100$ mV for the as-fabricated FET 100. The $I_{DS}$ increased by several orders of magnitude with the increase $V_G$, demonstrating n-type FET behavior. The current ON-OFF ratio of the device was found to be ~10$^4$. The field effect mobility of FET 100 can be calculated using the relation $\mu=(L/WC_G\times V_{DS})$ $(dI_{DS}/dV_G)$, $\mu=(L^2/C_G\times V_{DS})\times(dI_D/dV_C)$ where L is the channel length, W is the channel width and $C_G=\epsilon_0\epsilon_r/d$ is the capacitance between the substrate 112 (gate) and gate dielectric 122 (SiO$_2$), $C_c=(2\pi\epsilon L)/\ln(2h/r)$ with $\epsilon_r\sim3.9\epsilon_0$ being the effective dielectric constant of SiO$_2$, and d (=250 nm) is the silicon oxide thickness. The mobility of the FET 100 was calculated to be 6 cm$^2$/Vs.

Figure 2A:
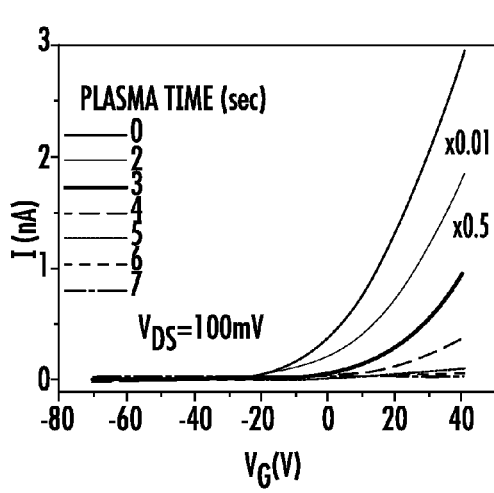
FIG. 2A shows gate dependence of the source drain current ($I_{DS}$) for an example $MoS_2$-based FET, where the curve corresponds to plasma exposure times of 0, 2, 3, 4, 5, 6, and 7 sec, respectively.
Figure 2B:
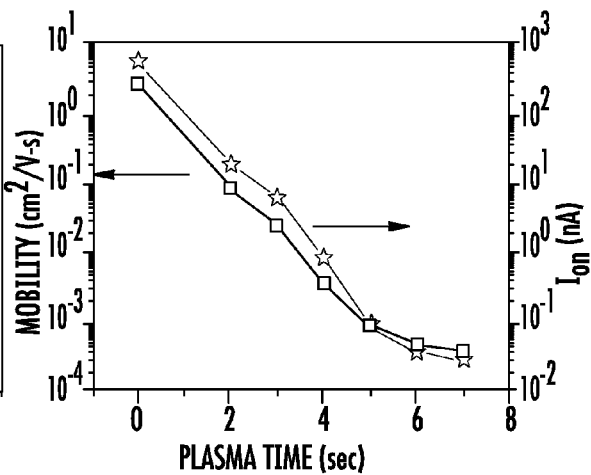
FIG. 2B shows the effect of plasma exposure on the ON current (at $V_G$=40V) and mobility of few layers $MoS_2$-based FET.

FIG. 2A shows the transfer characteristic at VDS=100 mV of FET 100 after each plasma exposure. Several interesting behaviors can be seen from this transfer characteristic curve. First, the drain current at all gate voltages decreases with an increase of oxygen plasma exposure. This can be more clearly seen in FIG. 2B (right axis) where there is a plot of the ON-current at $V_G=40$ V in a semi-log scale. The drain current was ~285 nA for the as fabricated sample, which decreased exponentially with time to value of less than 20 pA, a drop of more than four orders of magnitude, after only a total of 6 s plasma exposure time. After a 6 s exposure, the current become negligibly small. The rapid drop of current with oxygen plasma exposure evidences electrons are getting trapped in defect regions of the MoS$_2$ and the trapped states are increasing with increasing plasma exposure. The mobility of the device after each plasma exposure is calculated from the I–$V_G$ curves in FIG. 2A and is plotted in FIG. 2B (left axis) in a semi-log scale. Like the ON-current behavior, the mobility also drops exponentially from 6 cm$^2$/Vs for as fabricated sample to $4\times10^{-4}$ cm$^2$/Vs, after a 6 s plasma exposure. Similar to ON-current, the decrease of mobility is also more than four orders magnitude with plasma exposure.

Figure 3A:
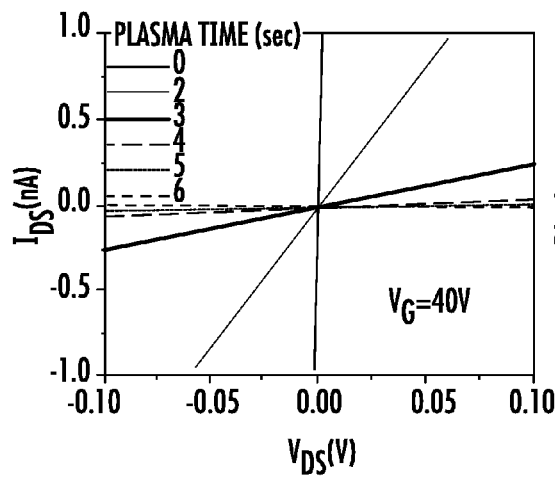
FIG. 3A is an $I_{DS}$ vs. $V_{DS}$ characteristics curve for the few layers $MoS_2$-based FET at different plasma exposure.
Figure 3B:
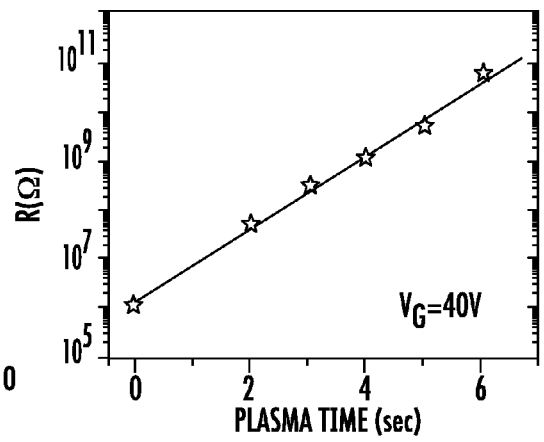
FIG. 3B shows the resistance of the FET as a function of plasma exposure time. The line shown is the linear fit of the logarithmic electrical resistance as a function of exposure duration.

FIG. 3A shows the dependence of current-voltage FET characteristics upon plasma exposure time. The $I_{DS}$–$V_{DS}$ graph of the device at $V_G=40$ V is plotted in FIG. 3A for different plasma exposure times. It is observed that at all exposure time the $I_{DS}$–$V_{DS}$ curves are linear around the zero bias representing Ohmic behavior. FIG. 3B demonstrates the dependence of resistance on the plasma exposure time. A large variation in resistance is observed after plasma exposure. The linear fit of the logarithmic resistance as a function of time indicates that the resistance increases exponentially upon plasma exposure. Similar changes in resistance were also observed for other gate voltages.

Similar device characteristics were obtained on two other single layer FETs. To explore the physical mechanism responsible for the observed change in electronic transport properties, Raman spectroscopy, X-ray photospectroscopy (XPS) and photoluminescence (PL) characterization of the pristine and plasma treated MoS$_2$ flakes were performed. Raman spectroscopy is a powerful tool to investigate changes in composition of 2D materials. The Raman signature of the pristine flake and the plasma treated monolayer were compared.

Figure 4A:
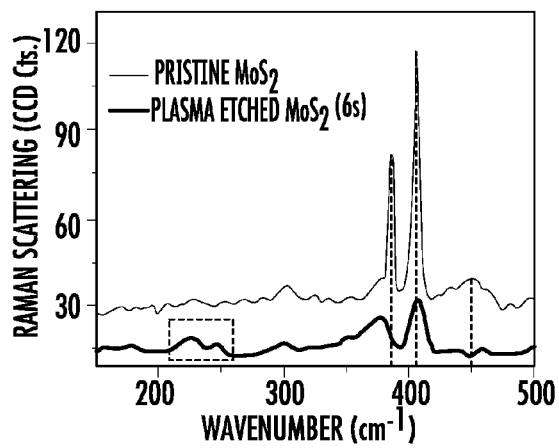
FIG. 4A is a Raman spectra of pristine $MoS_2$ and plasma etched $MoS_2$ obtained with a 532 nm excitation wavelength. While $MoS_2$ modes were conserved, new Raman peaks corresponding to Mo—O bonds in $MoO_3$ were measured in the flake after exposure.

FIG. 4A shows the Raman spectra of a representative single layer MoS$_2$ flake before and after 6 s of oxygen plasma treatment. The two Raman peak corresponding to $E_{2g}^1$ (~385 cm$^{-1}$) and $A_g^1$ (~410 cm$^{-1}$) modes, characteristic of MoS$_2$ observed in the pristine flake, clearly decrease in amplitude after treatment. Interestingly, $E_{2g}^1$ (in plane) is severely affected as a result of the treatment, while $A_g^1$ shifts only of 3 cm$^{-1}$ with a strong amplitude decrease (6 times) and a significant broadening. Finally the disappearance of the LAM mode at 450 cm$^{-1}$ also confirms the disruption of the MoS$_2$ lattice during oxygen plasma treatment. On the other hand, the apparition of other peaks observed in the 150-400 rel. cm$^{-1}$ range indicate the formation of Mo—O bonds in the system at 180 cm$^{-1}$ corresponding to the B$_{2g}$ vibrational mode of MoO$_3$, 225 cm$^{-1}$ corresponding to the B$_{3g}$ mode.

Figure 4B:
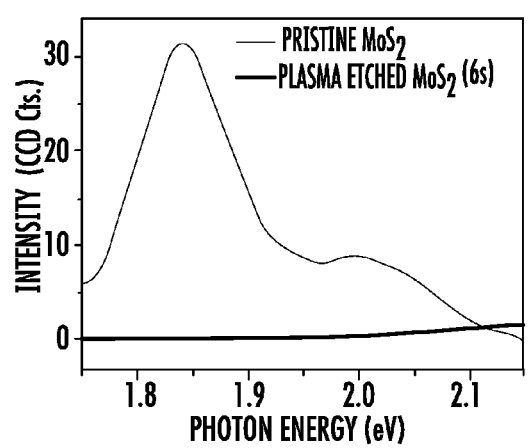
FIG. 4B shows PL spectra of the flake showing strong response of the monolayer and total PL quenching after plasma treatment.

Hence the electronic properties were explored using PL spectroscopy. As a result of oxygen plasma treatment, the PL of MoS$_2$ is fully quenched after 6 s of treatment (see FIG. 4B). Photoluminescence involves exciting excess electron-hole pairs optically with energy of the incident photons higher than the band gap of the semiconductor sample. The emitted radiation is a result of the radiative recombination in the sample. For single layer MoS$_2$, the PL distribution is centered around 1.84 eV (often referred to as exciton A1), with a second peak with lower amplitude around 1.0 eV (often referred to as exciton B1). A decrease in PL intensity, as seen in FIG. 4B indicates competing non-radiative processes removing excess carriers in the system. The results are indication of a reorganization of the excess carriers in presence of MoO$_3$.

Figure 5:
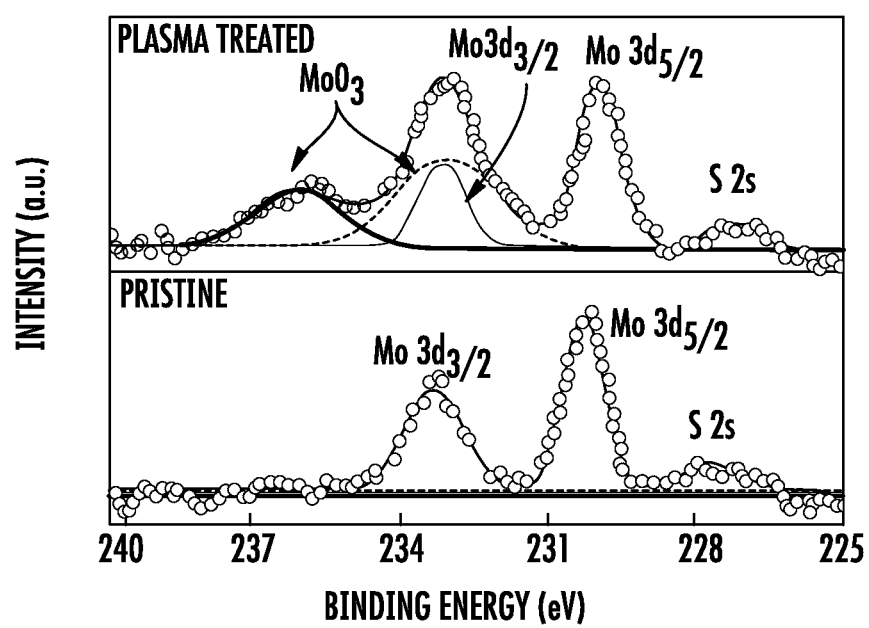
FIG. 5 is a X-ray photoelectron spectroscopy (XPS) spectrum of Mo (3d) and S(2 s) core levels for pristine (lower panel) and plasma treated (upper panel) $MoS_2$ flakes.

FIG. 5 show the XPS spectra of pristine MoS$_2$ and plasma treated MoS$_2$ respectively. Three prominent peaks were observed at energies 227 eV, 229.7 eV, and 233.1 eV in pristine MoS$_2$ sample, origin of which has been attributed to binding energy of S 2 s, Mo 3d$_{5/2}$ and Mo 3d$_{3/2}$ electrons in Mo—S bond of the MoS$_2$ crystal respectively. All these peaks were also found at same binding energies for the plasma treated sample, however an additional peak at energy 236.4 eV could be observed, corresponding to the higher oxidation state Mo$^{+6}$. This new peak further confirms the presence of MoO$_3$ in the plasma treated sample.

Figure 6A:
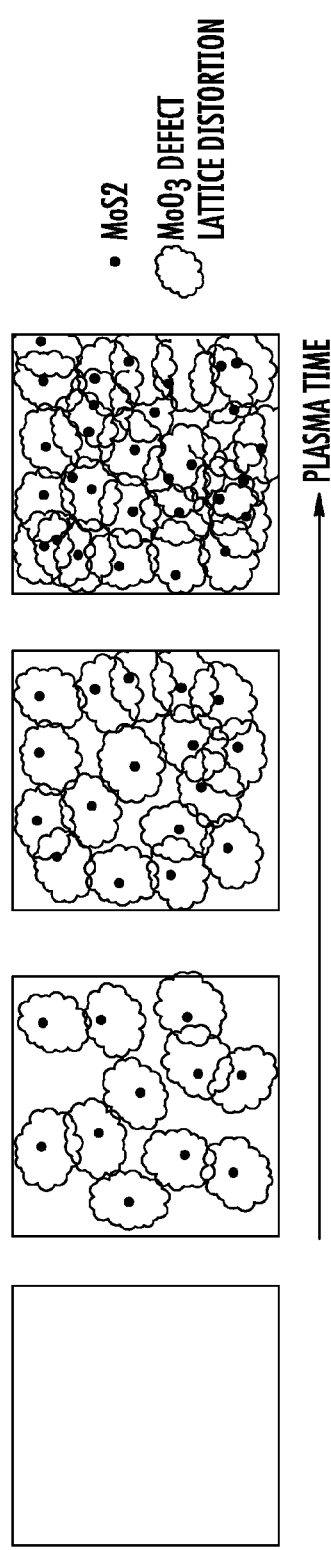
Figure 6B:
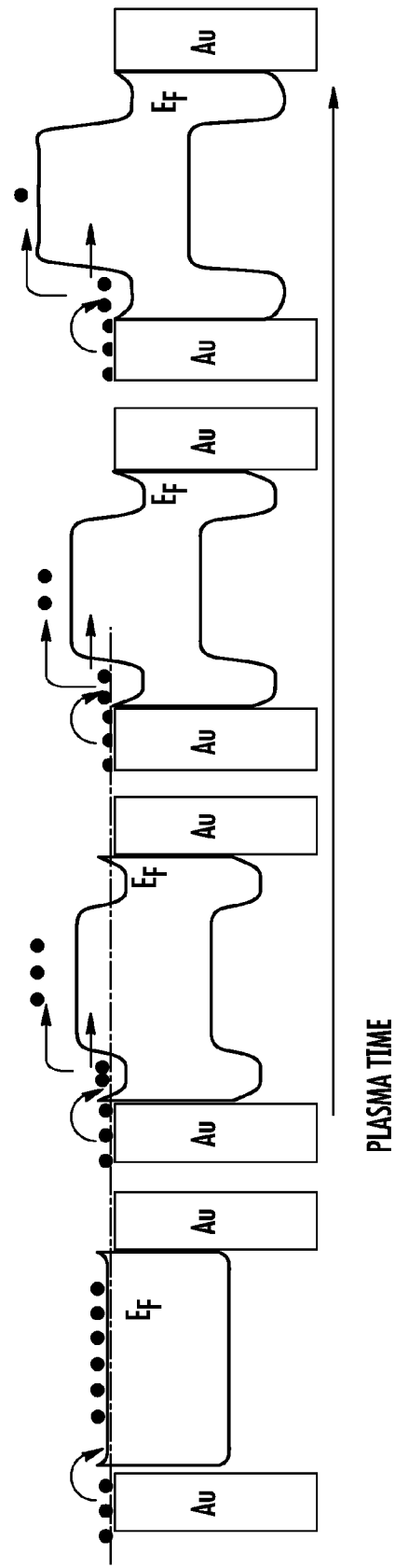
FIG. 6B shows the change in energy band diagram of multilayer $MoS_2$-based FET with plasma exposure time.

Based on the Raman, XPS and PL study, the following mechanism is proposed to explain the electrical property evolution of MoS$_2$ due to disclosed plasma treatment. During plasma treatment high energetic charge particles bombard on MoS$_2$ surface. Since S has much smaller mass compared to Mo, they move from the lattice site and lattice vacancies are created. Because of the excess oxygen supplied by the plasma, oxidation takes place at the defect sites in the surface. The oxidation process can be described as $2MoS_2 + 7O_2 = 2MoO_3 + 4SO_2$. The work function of MoO$_3$ is ~6.8 eV which is larger than that of MoS$_2$ (4.5 to 5.2 eV). As a result of this large work function difference, electron transfer can occur from MoS$_2$ to MoO$_3$ resulting in hole doping in MoS$_2$. In addition, MoO$_3$ has a bandgap of 3.2 eV-3.8 eV, making it electrically insulating in nature. Therefore, the creation of MoO$_3$ in MoS$_2$ hinders the charge transport. An exponential increase in resistance (FIGS. 3A, B) is indicative of percolation conduction mechanism in MoS$_2$ upon plasma exposure. This evidences that with increase of plasma exposure time, MoO$_3$ rich region increases in MoS$_2$ which creates significant distortion of lattice (FIG. 6A). Those lattice distortions create tunnel barriers (see FIG. 6B) inside the 2D materials which reduces the charge carrier transport through the device. The tunnel barrier height increases with the exposure time, and for high exposure of time completely cease the transport.

In order to investigate whether or not similar electronic property tuning can occur in multilayered MoS$_2$ flakes, devices were fabricated with 4 layer and 8 layer MoS$_2$ flakes. The results are summarized in FIGS. 7A-D (FIG. 7A for 1 layer, FIG. 7B for 4 layers and FIG. 7C for 8 layers). It can be seen that the plasma exposure time needed to see changes in mobility (also in current) increases with increasing MoS$_2$ thickness. For example, in single layer sample, a mobility of less than 0.001 cm$^2$/Vs was achieved in 6 sec while similar mobility change occurred in 8 layer sample in 60 sec. It was found that the time required to see changes in mobility linearly scale with the number of layer. This is shown in FIG. 7D where there is a plot the mobility/layer with time/layer. This demonstrates that a controlled tuning of electronic properties from single layer and multilayer TMDC sample such as MoS$_2$ is possible in a predictive way.

While various disclosed embodiments have been described above, it should be understood that they have been presented by way of example only, and not as a limitation. Numerous changes to the disclosed embodiments can be made in accordance with the Disclosure herein without departing from the spirit or scope of this Disclosure. Thus, the breadth and scope of this Disclosure should not be limited by any of the above-described embodiments. Rather, the scope of this Disclosure should be defined in accordance with the following claims and their equivalents.

Although disclosed embodiments have been illustrated and described with respect to one or more implementations, equivalent alterations and modifications will occur to others skilled in the art upon the reading and understanding of this specification and the annexed drawings. While a particular feature may have been disclosed with respect to only one of several implementations, such a feature may be combined with one or more other features of the other implementations as may be desired and advantageous for any given or particular application.

The invention claimed is:

1. A plasma-based processing method, comprising:
depositing a two dimensional (2D) semiconductor transition metal dichalcogenide (TMDC) material on a substrate, and
plasma treating said 2D semiconductor TMDC material in an oxygen comprising ambient to oxidize said 2D semiconductor TMDC material to form oxidized dielectric 2D TMDC material, said oxidized dielectric 2D TMDC material having a higher electrical resistivity as compared to said 2D semiconductor TMDC material before said plasma treating,
wherein said 2D semiconductor TMDC material has a thickness from 1 to 8 atomic layers, and wherein said plasma treating oxidizes said 2D semiconductor TMDC material to form defect regions throughout all said atomic layers of said 2D semiconductor TMDC material.

2. The method of claim 1, wherein said oxygen comprising ambient comprises oxygen mixed with an inert gas.

3. The method of claim 1, wherein said depositing comprises mechanically exfoliating said 2D semiconductor TMDC material from a bulk 2D semiconductor TMDC material onto said substrate.

4. The method of claim 1, wherein said 2D semiconductor TMDC material comprises MoS$_2$.

5. The method of claim 1, wherein said electrical resistivity of said oxidized dielectric 2D TMDC material is greater than 10$^3$ times said electrical resistivity of said 2D semiconductor TMDC material.

6. The method of claim 1, wherein said thickness of said 2D semiconductor TMDC material consists of a single layer.

7. A field effect transistor (FET), comprising:
an electrically conductive substrate,
a gate dielectric layer on said substrate;
an oxidized dielectric two dimensional (2D) transition metal dichalcogenide (TMDC) layer including localized dielectric oxide regions directly on said gate dielectric layer, said oxidized dielectric 2D TMDC layer having a higher electrical resistivity as compared to a 2D semiconductor TMDC layer;
a drain contact contacting one side of said oxidized dielectric 2D TMDC layer and a source contact contacting another side of said oxidized dielectric 2D TMDC layer.

8. The FET of claim 7, wherein said oxidized dielectric 2D TMDC layer has a thickness which corresponds to an oxidation of said 2D semiconductor TMDC layer that is from 1 to 8 atomic layers thick.

9. The FET of claim 7, wherein said substrate comprises n+ or p+ doped Si.

10. The FET of claim 7, wherein said gate dielectric layer comprises silicon dioxide (SiO$_2$), aluminum oxide (Al$_2$O$_3$), or hafnium oxide (HfO$_2$).

11. The FET of claim 7, wherein an ON-OFF current ratio for said FET is ≥10$^3$.

12. The FET of claim 8, wherein said thickness of said 2D semiconductor TMDC material consists of a single layer.

* * * * *